United States Patent [19]
Nomura

[11] Patent Number: 5,860,208
[45] Date of Patent: Jan. 19, 1999

[54] MOUNTING APPARATUS HAVING A TWO-DIMENSIONAL LINEAR MOTOR

[75] Inventor: Hiroaki Nomura, Ichinomiya, Japan

[73] Assignee: Brother Kogyo Kabushiki Kaisha, Aichi-ken, Japan

[21] Appl. No.: 812,207

[22] Filed: Mar. 6, 1997

[30] Foreign Application Priority Data

Mar. 7, 1996 [JP] Japan .................................. 8-050055

[51] Int. Cl.$^6$ .................................................. B23P 19/02
[52] U.S. Cl. ............................... 29/740; 29/712; 29/742; 29/743; 29/744; 29/759; 72/446; 72/482.9
[58] Field of Search ............................ 29/712, 740, 741, 29/742, 743, 744, 759, DIG. 44; 72/482.9, 446

[56] References Cited

U.S. PATENT DOCUMENTS 5,671,527  9/1997  Asai et al. ............................ 29/743 X
5,692,292  12/1997  Asai et al. ............................ 29/743 X

*Primary Examiner*—S. Thomas Hughes
*Assistant Examiner*—Rick Kiltae Chang
*Attorney, Agent, or Firm*—Kane, Dalsimer, Sullivan, Kurucz, Levy, Eisele and Richard, LLP

[57] ABSTRACT

A mounting apparatus includes two stages each, a carrier which carries two printed boards to respective stages and parts feeders located on both sides of the carrier. The mounting apparatus further includes two heads driven by two-dimensional linear motor system, each of which is arranged to mount electronic components onto the respective board. Since two boards are treated at the same time, large throughput is obtained. Further, since one board is treated by one head, the tangle of the cables does not occur.

15 Claims, 6 Drawing Sheets

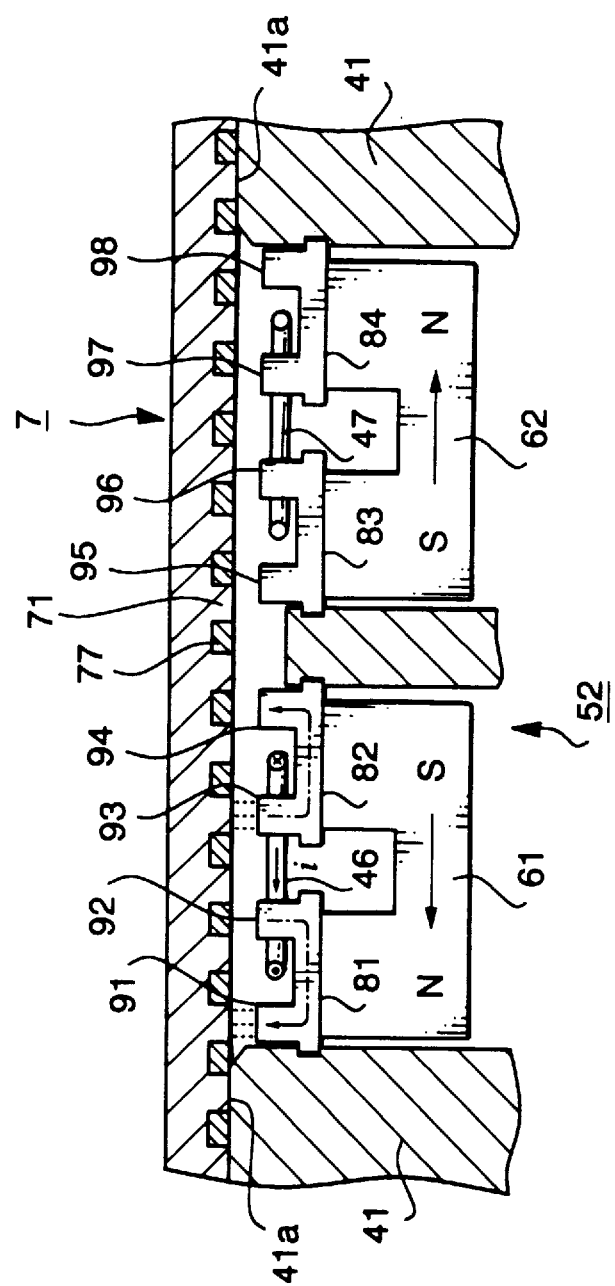

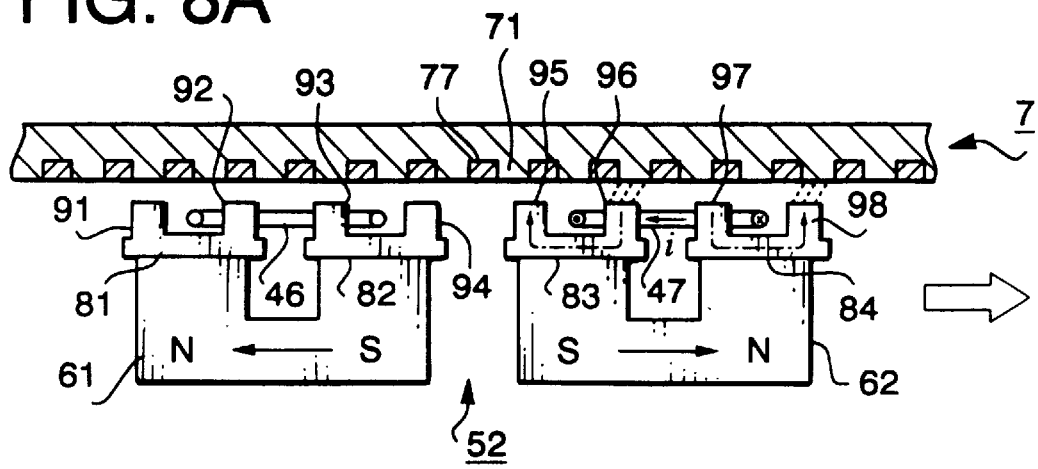
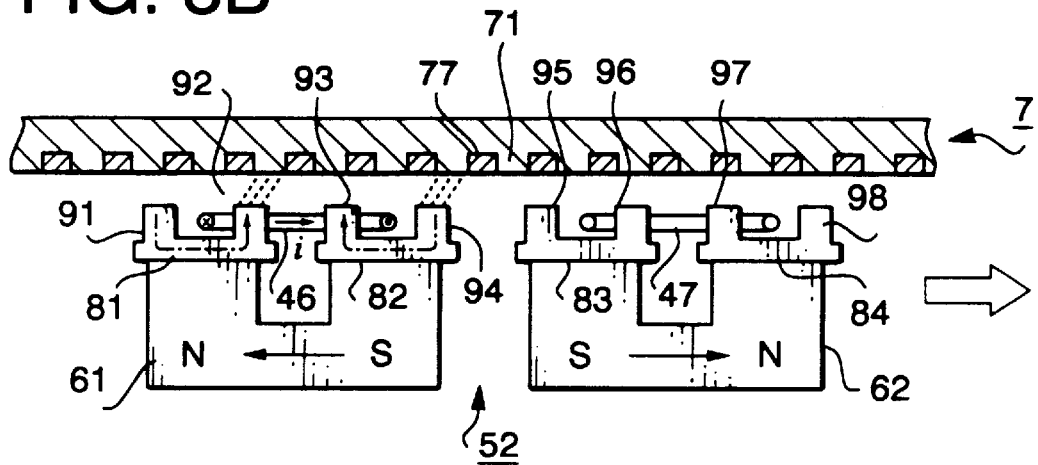
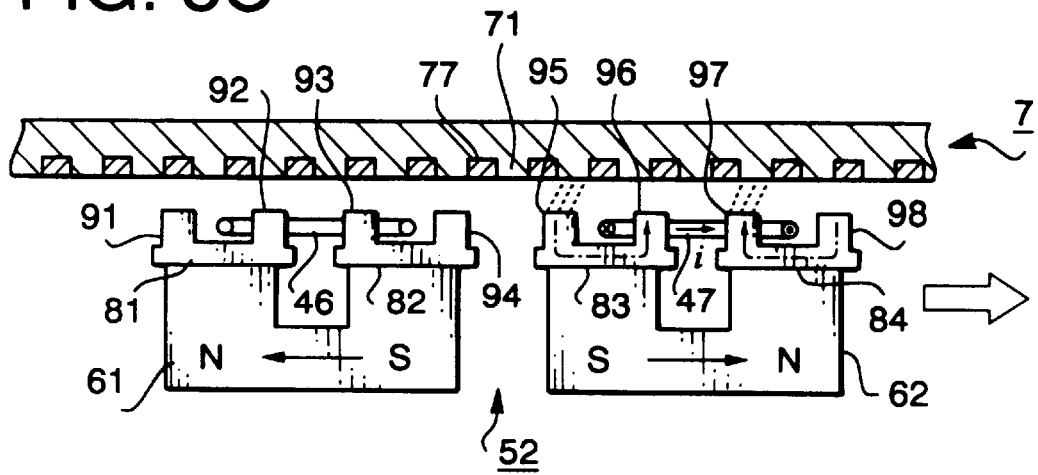

MOUNTING APPARATUS HAVING A TWO-DIMENSIONAL LINEAR MOTOR

BACKGROUND OF THE INVENTION

The present invention relates to a mounting apparatus used in an assembly line of a printed circuit board, for mounting electronic components onto the surface of the board.

Recently, a mounting apparatus enabling large throughput is proposed in Japanese Patent Laid-Open Publication No. HEI 6-216583. As shown in FIGS. 1 and 2, the mounting apparatus 100 includes a carrier 124 for carrying one board 113, three heads 108a, 108b and 108c for mounting electronic components onto the board 113, a parts feeder 111 for feeding electronic components, and an inspecting camera 112 for inspecting the orientation of the electronic components held by the heads 108a, 108b and 108c. Each of the heads 108a, 108b and 108c is arranged to pick up an electronic component from the parts feeder 111, to carry the electronic component to the position above the inspecting camera 112, and to mount the electronic component on the board 113 held on the carrier 124.

As shown in FIG. 2, the heads 108a, 108b and 108c are arranged to move around to successively take place each other. That is, when the first head 108a is positioned at the parts feeder 111, the second head 108b is positioned at the camera 112 and the third head 108c is positioned at the board 113. In the next step, the first head 108a moves to the camera 112, the second head 108b moves to the board 113, and the third head 108c moves to the parts feeder 111. In further next step, the first head 108a moves to the board 113, the second head 108b moves to the parts feeder 111, and the third head 108c moves to the camera 112.

However, since the mounting apparatus 100 has cables (wires and air tubes) leading to the heads 108a, 108b and 108c, when the heads 108a, 108b and 108c move around to successively take place each other as described above, it may cause the tangle of the cables. Further, in order to solve this problem by arranging the mounting apparatus 100, complicated arrangement is required, which is not practically feasible.

SUMMARY OF THE INVENTION

It is therefore an object of the present invention to provide an improved mounting apparatus enabling large throughput and free from the tangle of the cables.

According to an aspect of the present invention, a mounting apparatus includes a station that supports a plurality of boards. The station has a plurality of stages each of which supports respective board thereon. The mounting apparatus further includes a carrier that carries the plurality of boards to the respective stages, feeding device that feeds components, and a plurality of heads each of which is provided to respective stage, for picking up a component from the feeding device and mounting the component onto a board supported on the corresponding stage.

As constructed above, since a plurality of boards are treated at the same time, large throughput is obtained. Further as each board can be treated with one head, the tangle of the cables does not occur.

Optionally, the mounting apparatus can be provided with an inspecting device that inspects the orientation of the components picked up by the heads. With this, the components can be mounted onto the board in the correct orientation. Further, the feeding device includes a plurality of parts feeders respectively provided to the stages and the inspecting device includes a plurality of inspecting devices respectively provided to the stages. Thus, it becomes possible to provide at least one parts feeder and inspecting device to respective stage.

In a particular arrangement, the mounting apparatus includes a driving mechanism that moves the heads in two dimension within a plane parallel to the boards on the stages. With this, it becomes possible to move the heads to the boards and the parts feeders, with a simple mechanism. Preferably, the driving mechanism can be a two-dimensional linear motor system, what is called a "Sawyer Motor" disclosed in U.S. Pat. No. 3,376,578, No. 3,457,482 and No. 3,836,835. Thus, the driving mechanism becomes simple, compared with the apparatus using two combined individual linear drives.

In a preferred embodiment, the two-dimensional linear motor system includes at least one platen and movable elements respectively provided to the heads. The movable elements are movable in two dimension in parallel with the platen. Further, the platen includes magnetic and non-magnetic material both arranged in a grid. Each movable element includes at least one first electromagnet unit which cooperate with the platen to act as a first linear motor, and at least one second electromagnet unit which cooperate with the platen to act as a second linear motor. Such construction enables two-dimensional movement with a compact and simple mechanism.

Optionally, the platen is provided above the stages and the platen magnetically supports the heads therebeneath. With this, it becomes unnecessary to provide a supporting member for movably supporting the heads, which reduces the number of parts.

It is preferable that each head has a nozzle that picks up and holds components, which extends and can be protruded in the direction perpendicular to the plane. Since the head moves in two dimension and the nozzle protrudes in the other dimension, it becomes possible to move the tip of the nozzle in three dimension. The nozzle can be arranged to suck a component, so that the picking up of the component can be performed by suction. Further, each head has a positioning camera that recognizes a positioning mark provided on the board, so that the head can be accurately positioned with respect to the board.

According to another aspect of the invention, a mounting apparatus includes a station having at least one stage that supports the board thereon, a carrier that carries the board to the stage, a plurality of parts feeders provided to the stage and located on both sides of the carrier, and at least one head that picks up a component from one of the parts feeders and mounts the component onto the board.

Since the parts feeders are located on both sides of the carrier, it becomes possible to provide large number of parts feeders to the stage.

In a particular arrangement, a two-dimensional linear motor system is used to move the head. The two-dimensional linear motor system is above-mentioned "Sawyer Motor". This enables to move the head to the parts feeder located on either side of the carrier.

DESCRIPTION OF THE ACCOMPANYING DRAWINGS

FIG. 7 is a cross section of linear motor system of the mounting apparatus; and

FIGS. 8A, 8B and 8C are cross sections of the linear motor system of FIG. 7, showing the operation of the linear motor system.

DESCRIPTION OF THE EMBODIMENT

The embodiment of the present invention is described with reference to the accompanying drawings. A mounting apparatus of the embodiment is used in an assembly line of a printed circuit board, for mounting electronic components (such as chips or circuits) onto printed boards.

Figure 1:
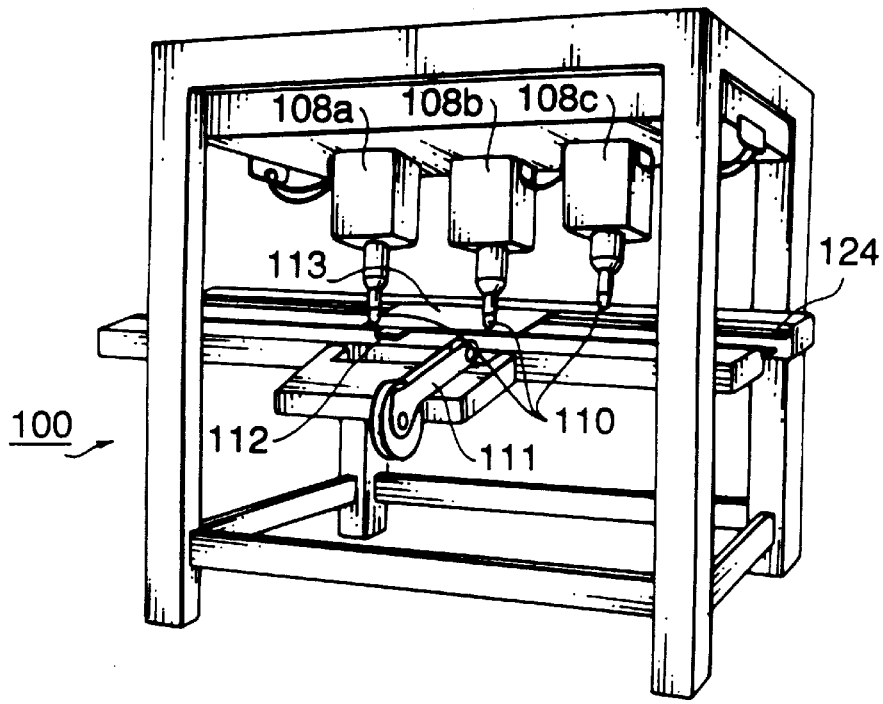
FIG. 1 is a perspective view of a conventional mounting apparatus.
Figure 2:
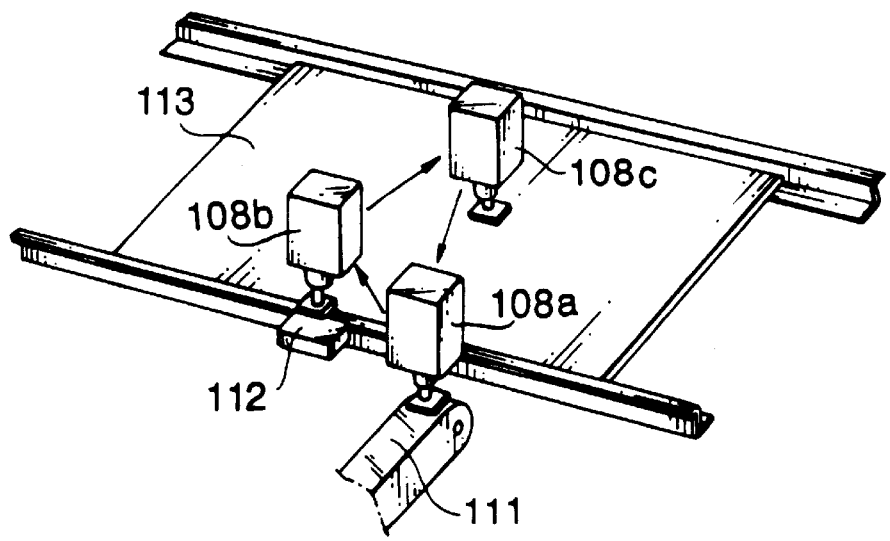
FIG. 2 is an enlarged perspective view of the mounting apparatus of FIG. 1.
Figure 3:
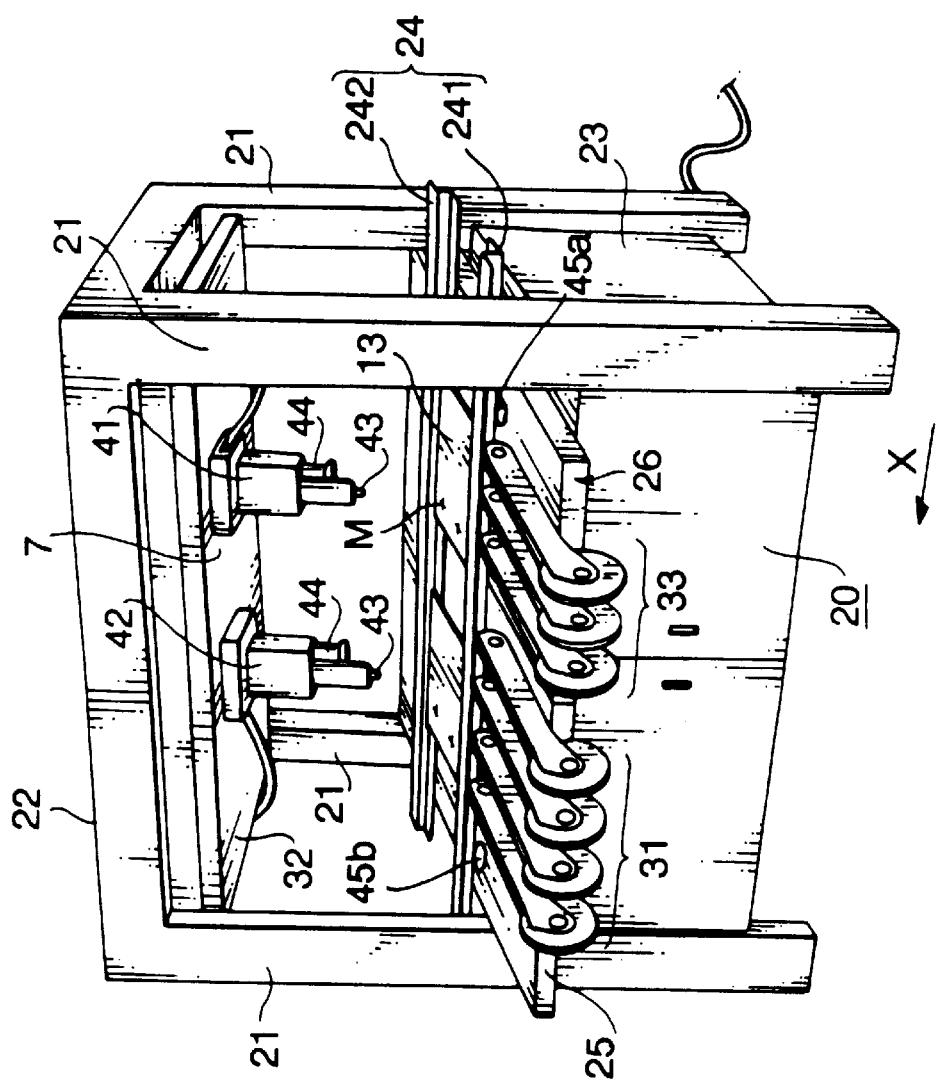
FIG. 3 is a perspective view of a mounting apparatus of the embodiment.

FIGS. 3 is a perspective view of the mounting apparatus 20 of the embodiment. As shown in FIG. 3, the mounting apparatus 20 includes a station 23, four pillars 21 provided to four corners of the station 23, and a top plate 22 provided above the station 23.

A platen 7 is provided below the top plate 22. A pair of heads 41 and 42 are provided beneath the platen 7. The heads 41 and 42 are magnetically supported by the platen 7 and movable within a plane as described later.

Figure 4:
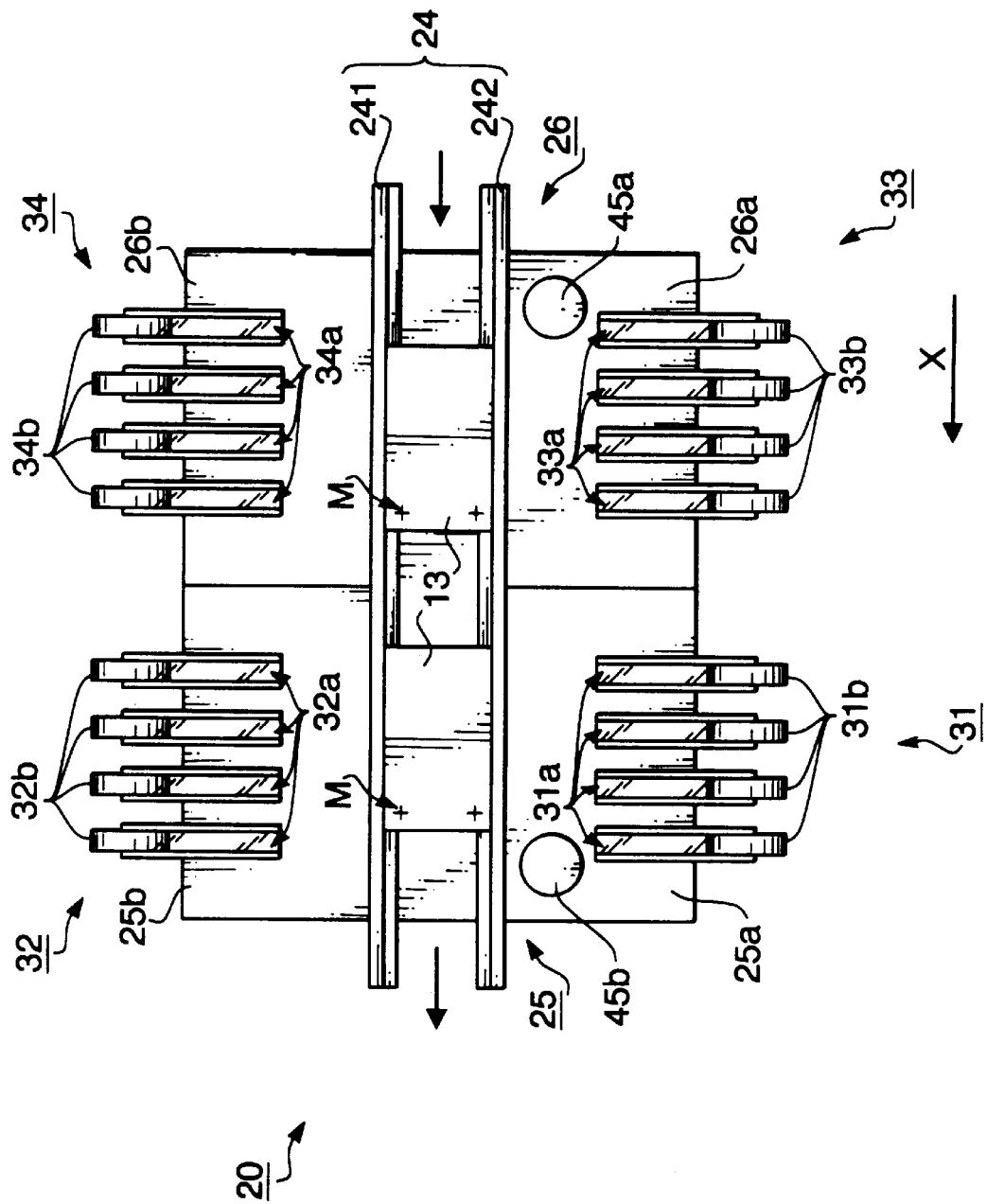
FIG. 4 is a plan view of stages of the mounting apparatus.

As illustrated in FIG. 4, the station 23 includes a right and left stages 25 and 26 in line with each other in the X-direction. A carrier 24 is provided to the station 23 for carrying printed boards 13. The carrier 24 includes a pair of folks 241 and 242 which support both ends of the printed boards 13 and move in the X-direction. Two printed boards 13 carried by the carrier 24 are respectively placed on the left and right stages 25 and 26. The positioning of the printed boards 13 is performed by alignment mechanisms (not shown) provided to the stages 25 and 26.

In order to feed electronic components to be mounted on the printed board 13, four parts feeders 31 are provided at a front part 25a of the stage 25 and four parts feeders 32 are provided at a rear part 25b of the stage 25. Similarly, four parts feeders 33 are provided at a front part 26a of the stage 26 and four parts feeders 34 are provided at a rear part 26b of the stage 26. The parts feeders 31, 32, 33 and 34 are so-called tape-type feeders, including tapes 31a, 32a, 33a and 34a on which electronic components (not shown) are adhered. The tapes 31a, 32a, 33a and 34a are respectively housed in cartridges 31b, 32b, 33b and 34b. By pulling the tapes out the cartridges, electronic components are carried to the vicinity of the printed boards 13.

As shown in FIG. 3, each of the heads 41 and 42 has a nozzle 43 at the lower end thereof. The nozzle 43 is vertically protruded by a not shown mechanism for picking a component from the parts feeders and mount the component onto the board 13. Each of the heads 41 and 42 further includes positioning camera 44, for recognizing a positioning mark M formed on the predetermined position of the printed board 13.

In this embodiment, the heads 41 and 42 are driven by means of a two-dimensional linear pulse motor, known as a "Sawyer motor", disclosed in U.S. Pat. No. 3,376,578, No. 3,457,482 and No. 3,836,835.

Figure 5:
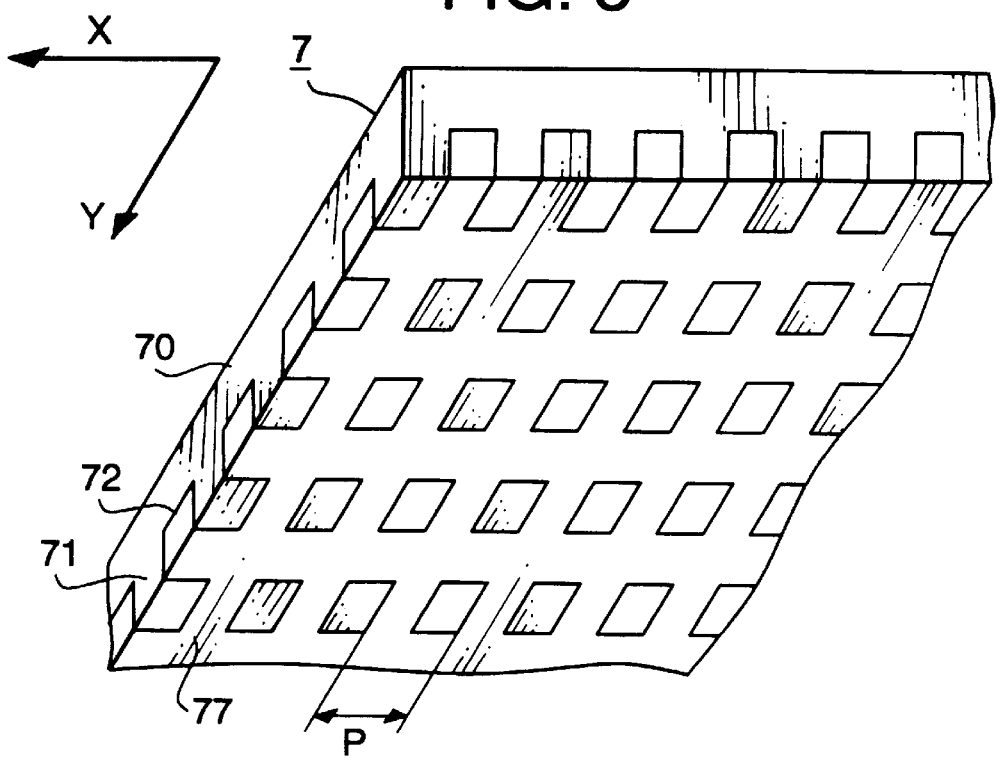
FIG. 5 is an enlarged perspective view of a platen of the mounting apparatus.

FIG. 5 is a bottom perspective view of the platen 7. The platen 7 includes a magnetic steel plate 70. The steel plate 70 is formed to have teeth 71 arranged in a grid along the X-axis and Y-axis. The grooves 72 among the teeth 71 are filled with a non-magnetic material such as epoxy resin. The portion of the non-magnetic material is designated by 77.

Figure 6:
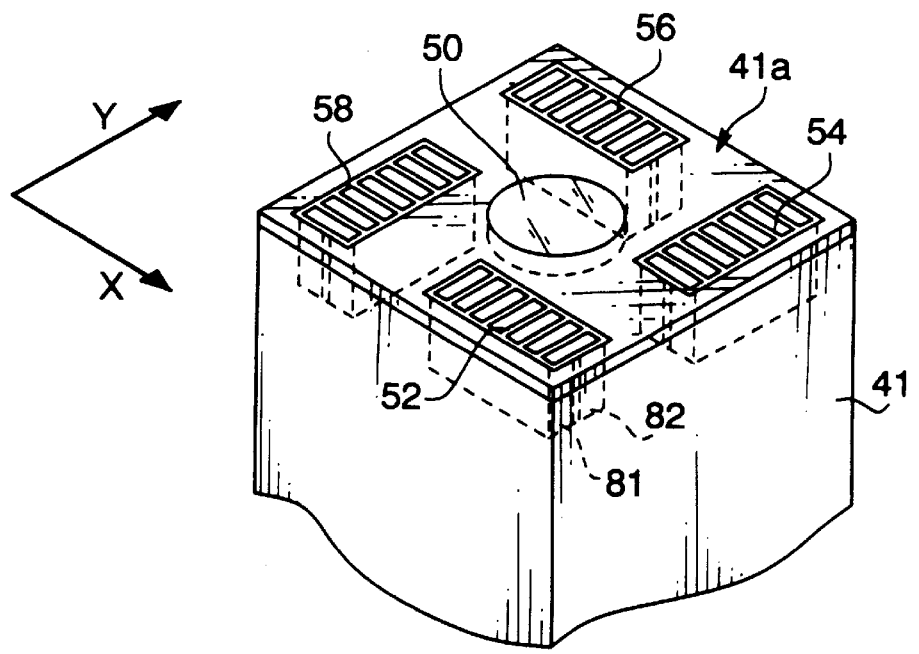
FIG. 6 is an bottom perspective view of the top portion of a head of the mounting apparatus.

FIG. 6 is a perspective view of a top portion 41a of the head 41. As shown in FIG. 6, four electromagnet units 52, 54, 56 and 58 are provided on the top portion 41a. FIG. 7 shows one electromagnet unit 52. As shown in FIG. 7, the electromagnet unit 52 includes two U-shaped yaws 61 and 62 both made of permanent magnet. Though the yaws 61 and 62 are placed side by side with each other as shown in FIG. 6, FIG. 7 shows the yaws 61 and 62 in such a manner that they are in line with each other for ease of explanation.

The yaw 61 has two pole pieces 81 and 82. The pole piece 81 has two teeth 91 and 92 at the tip thereof, both made of magnetic material. Similarly, the pole piece 82 has two teeth 93 and 94. A coil 46 is provided around the teeth 92 and 93, for energizing the pole pieces 81 and 82. The yaw 61 is so constructed that, when the teeth 91 and 93 are positioned beneath the teeth 71 of the platen 7, the other teeth 92 and 94 are positioned beneath the non-magnetic portions 77.

The yaw 62 is similarly constructed as the yaw 61. That is, the yaw 62 has pole pieces 83 and 84. The pole piece 83 has teeth 95 and 96 and the pole piece 84 has teeth 97 and 98. A coil 47 is provided around the teeth 96 and 97, for energizing the pole pieces 83 and 84.

The relationship between the yaws 61 and 62 is such that, when the teeth of one yaw are positioned beneath the teeth 71, the corresponding teeth of the other yaw are positioned midway between the teeth 71 and non-magnetic portions 77.

In FIG. 7, the head 41 is stopped. In FIG. 7, the current flows in the coil 46 and produces flux (shown by a dotted line) in pole pieces 81 and 82, while no current flows in coil 47. The flux produced in the coil 46 is added to bias flux produced by the permanent magnet (yaw) 61 at the teeth 91 and 93, and is subtracted from the bias flux produced by the permanent magnet 61 at the teeth 92 and 94. When the current in the coil 46 is at its maximum, the flux at the teeth 92 and 94 is almost zero. Accordingly, only the teeth 91 and 93 attract the teeth 71. Since the teeth 91 and 93 are beneath the metal teeth 71, the head 41 remains unmoved.

FIGS. 8A, 8B and 8C show the operation of the electromagnet unit 52. In FIG. 8A, the current in the coil 46 is cut and the current flows in the coil 47 in such a manner that the flux produced by the current in the coil 47 is subtracted from the bias flux produced by the permanent magnet (yaw) 62 at the teeth 95 and 97 to zero. Accordingly, only the teeth 96 and 98 attract the teeth 71, which are at the right above the teeth 96 and 98, the head 41 moves to the right.

When the teeth 96 and 98 reach to beneath the teeth 71 as shown in FIG. 8B, the current in the coil 47 is cut and the current flows in the coil 46 in such a manner that the flux produced by the current in the coil 46 is subtracted from the bias flux produced by the permanent magnet 61 at the teeth 91 and 93 to zero. Accordingly, only the teeth 91 and 93 attract the teeth 71, which are at the right above the teeth 91 and 92. Thus, the head 41 further moves to the right.

When the teeth 91 and 93 reach to beneath the teeth 71 as shown in FIG. 8C, the current in the coil 46 is cut and the current flows in the coil 47 in such a manner that the flux produced by the current in the coil 47 is subtracted from the bias flux at the teeth 96 and 98 to zero. Thus, the head 41 further moves to the right.

As constructed above, the head 41 moves half of the pitch P (FIG. 5) of the teeth 71, by switching the current flow in coils 46 and 47. The description of the movement of the head 41 of another half pitch is omitted.

As described above, the electromagnet unit 52 and the platen 7 act as an X-axis linear pulse motor. Since the electromagnet unit 56 is provided in parallel with the electromagnet unit 52, the electromagnet unit 56 and the platen 7 act as another X-axis linear pulse motor. Further, since the electromagnet units 52 and 56 are symmetrically arranged with respect to the center of the top portion 41a, unintentional rotation of the head 41 can be prevented. Similarly, the electromagnet units 54 and the platen 7 act as a Y-axis linear pulse motor and the electromagnet units 58 and the platen 7 act as another Y-axis linear pulse motors. Thus, the head 41 is moved along X-axis and Y-axis, by driving electromagnet units 52, 54, 56 and 58.

Further, a permanent magnet 50 is provided in the center of the top portion 41a of the head 41 as shown in FIG. 6. The permanent magnet 50 and the teeth 71 of the platen 7 (FIG. 5) attract each other so that the head 41 floats beneath the platen 7. That is, the head 41 is magnetically supported by the platen 7. In FIG. 7, the top surface 41a of the head 41 sildably contact with the platen 7. However, it is possible to provide air nozzle to create an air gap between the platen 7 and the top surface 41a, for obtaining more smooth movement. Since the head 42 is similarly constructed as the head 41, the description of the head 42 is omitted.

As described above, the heads 41 and 42 are moved along X-axis and Y-axis beneath the platen 7.

The mounting operation of the mounting apparatus 20 is described with reference to FIG. 3. The carrier 24 carries two printed boards 13 respectively to the stages 25 and 26, where the printed boards 13 are positioned by the not shown alignment mechanisms. Then, the heads 41 and 42 respectively move to the predetermined position to recognize the positioning marks M formed on the printed boards 13 placed on the stages 25 and 26. The heads 41 and 42 then respectively move to the parts feeders 31(or 32) and 33 (or 34) to pick up components and carry them to the positions above the inspecting cameras 45a and 46a. The heads 41 and 42 are arranged to move or rotate for compensating the position of the components held by the heads 41 and 42, according to the detection of the inspecting cameras 45a and 46a. Then, the head 41 and 42 respectively move to the predetermined positions of the printed boards 13 held on the stages 25 and 26 to mount the components onto the printed boards 13. After the heads 41 and 42 have completed the mounting operation, the carrier 24 discharges the printed boards 13 to a not shown apparatus placed downstream of the mounting apparatus 20.

As described above, since the mounting apparatus 20 has two stages 25 and 26 and two heads 41 and 42, and since each head is exclusively used for treating on one printed board, large throughput is obtained. Further, since one board 13 can be treated by one head, the mounting apparatus 20 is free from the tangle of the cables.

In addition, since the parts feeders 31, 32, 33 and 34 are located on both sides of the carrier 24, it becomes possible to provide large number of parts feeders to the stages 25 and 26.

The present disclosure relates to subject matter contained in Japanese Patent Application No. HEI 08-50055 filed on Mar. 7, 1996, which are expressly incorporated herein by reference in their entirety.

What is claimed is:

1. A mounting apparatus for mounting components onto boards comprising:
   a station that supports a plurality of boards, said station having a plurality of stages, each of said stages supporting each of said plurality of boards thereon;
   a carrier that carries said plurality of boards to said plurality of stages respectively;
   a feeding device that feeds components;
   a plurality of heads, each of which is provided at a respective stage for picking up a component from said feeding device and mounting said component onto a board supported on the corresponding stage; and
   a driving mechanism for driving said plurality of heads in two dimensions within a plane parallel to said boards supported on said stages, said driving mechanism comprising:
   a single platen; and
   at least one first electromagnet unit provided on each of said plurality of heads cooperating with said single platen to act as a first linear motor for driving said head in an X-direction of said plane and at least one second electromagnet unit provided on each of said plurality of heads cooperating with said single platen to act as a second linear motor in a Y-direction of said plane.

2. The mounting apparatus according to claim 1, further comprising an inspecting device that inspects the orientation of said components held by said heads.

3. The mounting apparatus according to claim 2, wherein said feeding device comprises a plurality of parts feeders respectively provided to said stages, and wherein said inspecting device comprises a plurality of inspecting cameras respectively provided to said stages.

4. The mounting apparatus according to claim 1, wherein said plurality of stages are arranged in line with a carrying path of said carrier.

5. The mounting apparatus according to claim 1, wherein said platen comprises magnetic material and non-magnetic material both arranged in a grid.

6. The mounting apparatus according to claim 1, wherein said platen is provided above said stages and said platen magnetically supports said heads therebeneath.

7. The mounting apparatus according to claim 1, wherein each of said heads has a nozzle that picks up and holds said component, and wherein said nozzle extends and can be protruded in the direction perpendicular to said plane.

8. The mounting apparatus according to claim 7, wherein said nozzle is arranged to suck a component to pick up and hold said component.

9. The mounting apparatus according to claim 1, wherein said carrier includes a pair of folks that support two side ends of each of said boards.

10. The mounting apparatus according to claim 1, wherein said head has a positioning camera that recognizes a positioning mark provided on said board, thereby to detect the position of said head with respect to said board.

11. A mounting apparatus for mounting components onto boards comprising:
   a station that supports a plurality of boards, said station having a plurality of stages, each of said stages supporting each of said plurality of boards thereon;
   a carrier that carries said plurality of boards to said plurality of stages respectively;
   a plurality of parts feeders located on both sides of said carrier, each of said parts feeders provided at a respective stage;
   a plurality of heads, each of which is provided at a respective stage to pick up a component from one of said parts feeders and to mount said component onto a board supported on the corresponding stage; and a driving mechanism for driving said plurality of heads in two dimensions within a plane parallel to said boards supported on said stages, said driving mechanism comprising:

a single platen; and at least one first electromagnet unit provided on each of said plurality of heads cooperating with said single platen to act as a first linear motor for driving said head in an X-direction of said plane and at least one second electromagnet unit provided on each of said plurality of heads cooperating with said single platen to act as a second linear motor for driving said head in a Y-direction of said plane.

12. The mounting apparatus according to claim 11, wherein said platen comprises magnetic material and non-magnetic material both arranged in a grid.

13. The mounting apparatus according to claim 11, further comprising a plurality of inspecting cameras respectively provided to said plurality of stages, each of said inspecting device being arranged for inspecting the orientation of a component held by one of said heads.

14. A mounting apparatus for mounting components onto boards comprising:

a station having at least one stage that supports said board thereon;

a carrier that carries said board to said stage;

a plurality of parts feeders provided at said stage and located on both sides of said carrier to feed components to said stage;

a plurality of heads for picking up a component from one of said parts feeders and mounting said component onto said board; and a driving mechanism for driving said plurality of heads in two dimensions within a plane parallel to said board supported on said stage, said driving mechanism comprising:

a single platen; and at least one first electromagnet unit provided on each of said plurality of heads cooperating with said single platen to act as a first linear motor for driving said head in an X-direction of said plane and a second electromagnet unit provided on each of said plurality of heads cooperating with said single platen to act as a second linear motor for driving said head in a Y-direction of said plane.

15. The mounting apparatus according to claim 14, wherein said platen comprises magnetic material and non-magnetic material both arranged in a grid.

\* \* \* \* \*